United States Patent [19]

Hawrylo

[11] 4,439,399

[45] Mar. 27, 1984

[54] QUATERNARY ALLOY

[75] Inventor: Frank Z. Hawrylo, Trenton, N.J.

[73] Assignee: The United States of America as represented by the Secretary of the Air Force, Washington, D.C.

[21] Appl. No.: 375,642

[22] Filed: May 6, 1982

[51] Int. Cl.$^3$ ............................................. C22C 30/00
[52] U.S. Cl. .................................... 420/580; 148/171
[58] Field of Search ............... 420/580, 513, 555, 579; 148/442, 441, 175, 171

[56] References Cited

U.S. PATENT DOCUMENTS

| 2,956,023 | 10/1960 | Fredrick et al. | 420/579 |
| 3,705,659 | 12/1972 | Kun | 148/175 |
| 3,753,801 | 8/1973 | Lockwood et al. | 148/171 |
| 3,962,716 | 6/1976 | Petroff et al. | 357/18 |
| 3,982,261 | 9/1976 | Antypas | 357/16 |
| 4,072,544 | 2/1978 | DeWinter et al. | 148/171 |
| 4,190,470 | 2/1980 | Walline | 148/175 |

OTHER PUBLICATIONS

W. Michael Yim, "Solid Solutions in the Pseudobinary (III-V)-(II-VI) Systems and Their Optical Energy Gaps", May, 1969 *Journal of Applied Physics*, vol. 40, No. 6, pp. 2617-2622.

*Primary Examiner*—L. Dewayne Rutledge
*Assistant Examiner*—Debbie Yee
*Attorney, Agent, or Firm*—Donald J. Singer; Stanton E. Collier

[57] ABSTRACT

A wide band gap semiconductor alloy having a combination of P, In, Te, and Zn is formed by liquid phase epitaxy on an InP substrate. This alloy can be used for the formation of p-n junctions.

2 Claims, 3 Drawing Figures

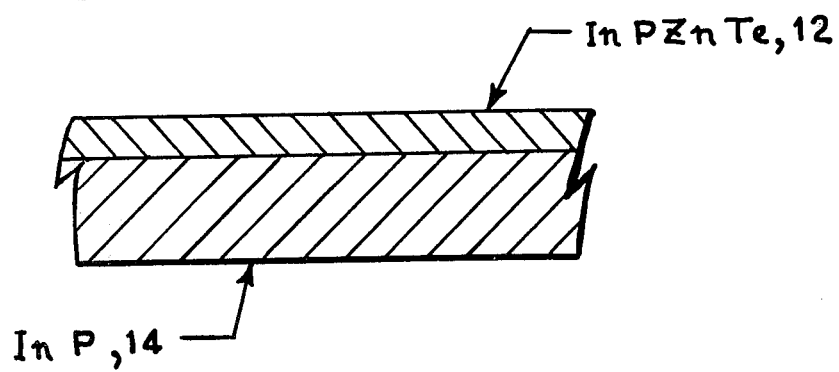
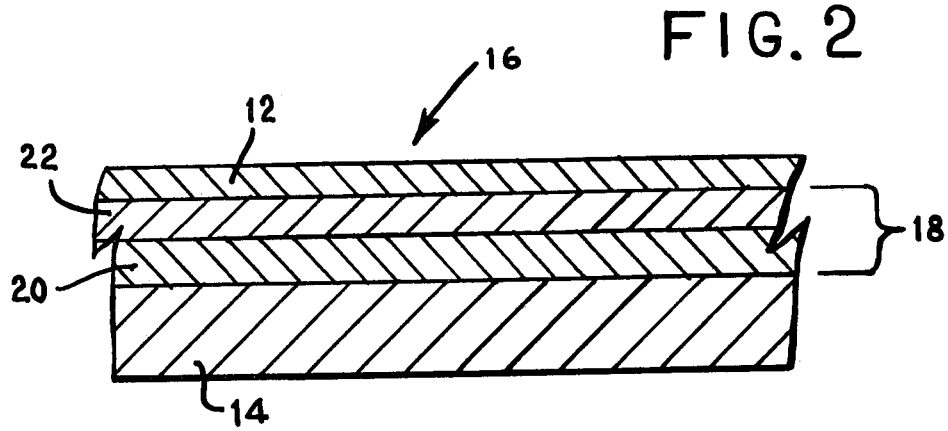
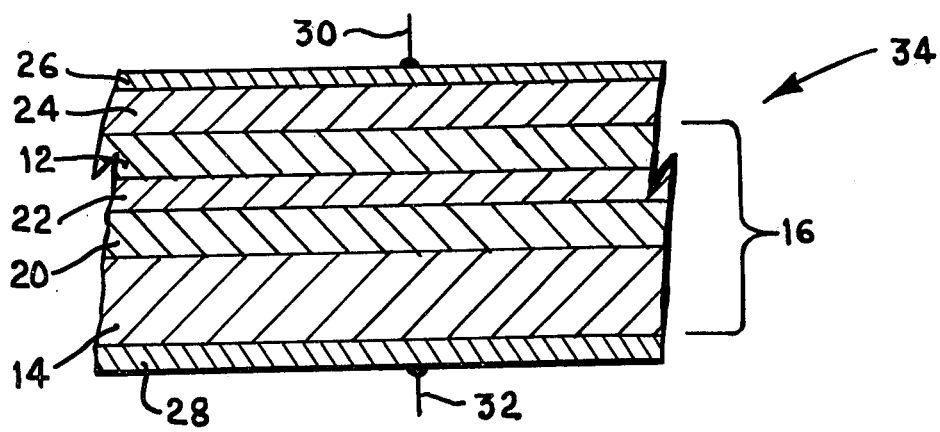

QUATERNARY ALLOY

STATEMENT OF GOVERNMENT INTEREST

The invention described herein may be manufactured and used by or for the Government for governmental purposes without the payment of any royalty thereon.

BACKGROUND OF THE INVENTION

This invention relates to semiconductor devices, and more particularly, to a wide band gap p-type semiconductor alloy and method of making and using same.

There is considerable interest in developing new semiconductor materials for use in such devices as light emitting p-n junctions used in fiber optics communications. The formation of quaternary semiconductor alloys useful in the formation of light emitting p-n junctions has been difficult if not impossible. Immiscibility problems between the III-V and II-VI compounds has hindered the search for new materials. Further, finding a method of making a useful product is difficult because of high melting points and dissociation pressures.

SUMMARY OF THE INVENTION

As noted, there is always a need for new semiconductor materials having desired properties suitable for use in semiconductor devices. The present invention is directed toward satisfying that need.

A method of forming a quaternary semiconductor alloy using liquid phase epitaxy is disclosed wherein the new alloy is composed of groups II-VI/III-V elements; specifically, indium, phosphorous, zinc and tellurium.

As to the method, elemental zinc is added to a liquid growth solution containing indium, indium phosphide, and tellurium, and deposited on an indium phosphide substrate by liquid phase epitaxy thus forming a indium, phosphorous, zinc, tellurium (InPZnTe) semiconductor alloy layer thereon.

This new semiconductor alloy can be used in forming light emitting diodes wherein two oppositely doped layers of this alloy are formed on a graded substrate.

One object of this invention is to provide a new semiconductor alloy;

Another object of this invention is to priovide a wide band gap semiconductor alloy;

A further object of this invention is to provide a process of making a new quaternary semiconductor alloy; and A still further object of this invention is to provide a new wide band gap semiconductor alloy that emits light and can be used in light emitting diodes.

These and many other objects of the present invention will be readily apparent to one skilled in the art to which the invention pertains from a perusal of the claims and of the following detailed description of a preferred embodiment of the invention.

BRIEF DESCRIPTION OF THE DRAWING

FIG. 1 of the invention is a cross section of the quaternary alloy upon a seed substrate;

FIG. 2 is a cross section of a semiconductor device having the quaternary alloy thereon; and FIG. 3 is a cross section of a light emitting diode using the alloy of this invention.

DETAILED DESCRIPTION OF THE PREFERRED EMBODIMENT

Zinc telluride is a group II-VI semiconductor compound having an energy bandgap of 2.15 electron volts. Indium phosphide is a group III-V semiconductor compound having an energy bandgap of 1.35 electron volts. Both compounds are direct transition materials and zinc telluride is the only group II-VI compound that has a natural p-type conductivity. Tellurium acts as a donor in indium phosphide and zinc acts as an acceptor in indium phosphide. By combining tellurium and zinc with indium phosphide, a new semiconductor alloy is possible.

This new semiconductor alloy is formed by using the liquid phase epitaxy process. In the liquid phase epitaxial growth, an apparatus and method are used similar to that disclosed by Lockwood et al in U.S. Pat. No. 3,753,801, issued Aug. 21, 1973, and entitled "Method of Depositing Epitaxial Semiconductor Layers from the Liquid Phase" and is incorporated herein by reference.

This new quaternary alloy is grown on an indium phosphide substrate. The growth solution is composed of 34.1 milligrams by weight of elemental zinc, 4.9968 grams of indium, 54.3 milligrams of indium phosphide, and 105 milligrams of tellurium.

The growth solution, as noted above, and a substrate 14, referring to FIG. 1, are typically contained in a slide boat of the type disclosed by Lockwood et al, referred to above. Substrate 14 is placed in a recess in the slide and the mixture is placed in a bin of the boat which is then placed in a furnace. While maintaining the flow of a reducing gas, such as hydrogen, or an inert gas, such as argon, through the furnace, the boat and its contents are heated to a temperature of about 700° C. at which the constituents of the mixture become molten and homogenized to form the growth solution. For the mixture of indium, indium phosphide, zinc and tellurium, noted above, this temperature is typically in the range between about 500° C. and about 700° C. The boat is then held at this temperature for a period of time such as one hour to insure complete homogenization of the resulting solution.

At about 700° C., the slide with indium phosphide substrate 14 is moved into the first bin which contains a wipe solution of indium; thereafter, the slide is moved into the second bin which contains the growth solution noted above. The temperature is then lowered 15° C. per minute, starting at 650° C., until about 500° C. is reached taking about ten minutes. This saturated solution of In,P,Zn, and Te deposits a 6.0 micrometer thick layer 12 on indium phosphide substrate 14.

After a layer 12 of the desired thickness is deposited, substrate 14 is removed from the bin containing the solution. Substrate 14 having layer 12 thereon can then be removed from the furnace.

X-ray measurements of layer 12 formed on indium phosphide substrate 14 revealed a lattice parameter of 5.938 angstroms for the semiconductor alloy formed thereon. Zinc telluride has a lattice parameter of 6.085 angstroms and indium phosphide has a lattice parameter of 5.8692 angstroms. These lattice parameters indicate that the new alloy of indium, phosphorous, zinc, and tellurium is rich in zinc telluride.

An analysis of InPZnTe layer 12 at a depth of 50 angstroms by secondary ion mass spectroscopy (SIMS) revealed the following normalized atomic concentrations: phosphorous, 34.5%, indium, 29.4%; tellurium, 23.0%; and zinc, 11.6%. This was based on the sputter rate of tantalum pentoxide.

This growth method produces a graded alloy having a predetermined lattice constant between the binary compounds used. The grading of layer 12 produced can be such that layer 12 is least strained. This is controlled by composition variations and layer thickness. Once layer 12 is grown and characterized p or n-type, lattice matched, etc., a following layer of the same alloy, doped oppositely, may be grown to form a p-n junction device.

Because of the lattice mismatch between InPZnTe layer 12 and InP substrate 14, a more operable combination is demanded. Referring to FIG. 2, semiconductor device 16 includes substrate 14, at least one graded substrate 18, and at least one semiconductor layer 12. Substrate 14 can be InP, InAs, GaAs, or GaSb. With respect to graded substrate 18, substrate 18 may include at least one graded layer or layers such as 20 and 22. One graded semiconductor alloy is InAsP. Another is GaAsSb. By controlling the composition variations and layer thickness of InAsP, for example, the lattice parameter will be between InP and InAs. The exact lattice parameter of graded layer 20 of InAsP can then be adjusted so as to place the least possible strain upon the interface between layer 20 and substrate 14 of InP or InAs. Additional graded layers such as graded layer 22 can be added to make the lattice parameter more compatible with semiconductor layer 12.

A light emitting p-n junction device 34 is shown in FIG. 3. Semiconductor device 16 of FIG. 2 is formed wherein semiconductor layer 12 is doped with an n-type dopant, for example. An additional semiconductor layer 24 of InPZnTe doped oppositely to layer 22 is formed on semiconductor layer 22. Onto substrate 14 and semiconductor layer 24, electrical contact layers 26 and 28 are formed by conventional means. Electrical leads 30 and 32 are attached by conventional means to contact layers 26 and 28 respectively. Electrical current passed through device 34 causes light to be emitted from the p-n junction area.

Due to the direct transition of both compounds used in forming this InPZnTe alloy, the possibility for light emission at about 6000 angstrom was examined. Using the krypton 6471 angstrom line of a 400 milliwatt cavity or the argon 5145 angstrom line of a 500 milliwatt cavity, a weak photo luminescence in the region of 7400 angstroms was detected. No other peak luminescence was detected in the range 7000 to 8500 angstroms.

Thus, the above description taken together with the following claims constitute a disclosure such as to enable a person skilled in metallurgical art having the benefit of the teaching herein to make and use the invention described herein.

What is claimed is:

1. A semiconductor quarternary alloy being a solid solution consisting of indium, phosphoros, zinc, and tellurium.

2. A semiconductor alloy as defined in claim 1, wherein the atomic percentages are about 30% indium, 35% phosphorous, 10% zinc, and 25% tellurium.

* * * * *